US010957396B2

(12) United States Patent
Lee et al.

(10) Patent No.: US 10,957,396 B2
(45) Date of Patent: Mar. 23, 2021

(54) SYNAPSE STRING AND SYNAPSE STRING ARRAY FOR NEURAL NETWORKS

(71) Applicant: Seoul National University R&DB FOUNDATION, Seoul (KR)

(72) Inventors: Jong-Ho Lee, Seoul (KR); Sung-Tae Lee, Gwacheon-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/815,571

(22) Filed: Mar. 11, 2020

(65) Prior Publication Data
US 2020/0294602 A1 Sep. 17, 2020

(30) Foreign Application Priority Data

Mar. 15, 2019 (KR) ........................ 10-2019-0030116

(51) Int. Cl.
*G11C 16/12* (2006.01)
*G06N 3/06* (2006.01)
*G06N 3/063* (2006.01)
*G11C 16/14* (2006.01)

(52) U.S. Cl.
CPC ............. *G11C 16/12* (2013.01); *G06N 3/063* (2013.01); *G11C 16/14* (2013.01)

(58) Field of Classification Search
CPC ......... G11C 16/12; G11C 16/14; G11C 16/10; G11C 16/28; G11C 16/32; G11C 16/08; G11C 16/24; G11C 11/54; G11C 16/0483; G06N 3/063
See application file for complete search history.

(56) References Cited

U.S. PATENT DOCUMENTS 9,767,408 B1 * 9/2017 Boybat Kara ....... G06N 3/0635
2017/0033120 A1 * 2/2017 Lee ................... H01L 27/11575

FOREIGN PATENT DOCUMENTS

WO 2013000939 1/2013

OTHER PUBLICATIONS

Bankman, et al., An Always-On 3.8uJ/86% CIFAR-10 Mixed-Signal Binary CNN Processor with All Memory on Chip in 28nm CMOS, Machine Learning and Signal Processing, 2018, pp. 222-224.

(Continued)

*Primary Examiner* — Ajay Ojha
(74) *Attorney, Agent, or Firm* — Cantor Colburn LLP

(57) ABSTRACT

Provided is synapse strings and synapse string arrays. The synapse string includes: first and second cell strings, each having a plurality of memory cell devices connected in series; and first switch devices, each connected to one of two ends of each of the first and second cell strings. The memory cell devices of the first cell string and the memory cell devices of the second cell string are in one-to-one correspondence to each other, and terminals of pairs of the memory cell devices being in one-to-one correspondence to each other are applied with read voltages and electrically connected to each other to constitute one synapse morphic device, so that the synapse string includes a plurality of synapse morphic devices connected in series. The synapse string includes a peripheral circuit and a reference current source for implementing a function of a neuron.

20 Claims, 12 Drawing Sheets

(56) References Cited

OTHER PUBLICATIONS

Merrikh-Bayat, et al., High-Performance Mixed-Signal Neurocomputing With Nanoscale Floating-Gate Memory Cell Arrays, IEEE Transactions on Neural Networks and Learning Systems, 2018, pp. 4782-4790.

Sun, et al., XNOR-RRAM: A Scalable and Parallel Resistive Synaptic Architecture for Binary Neural Networks, Design, Automation and Test in Europe, 2018, pp. 1423-1428.

* cited by examiner

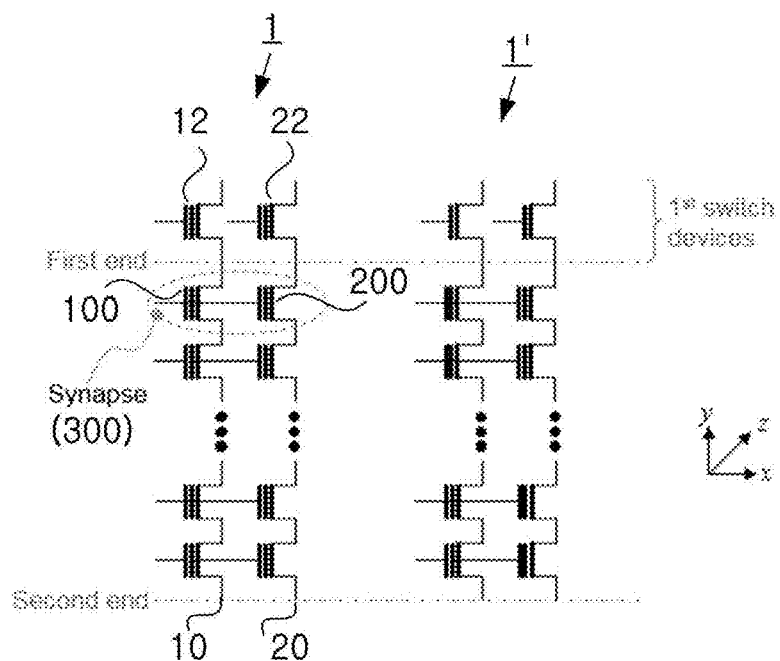
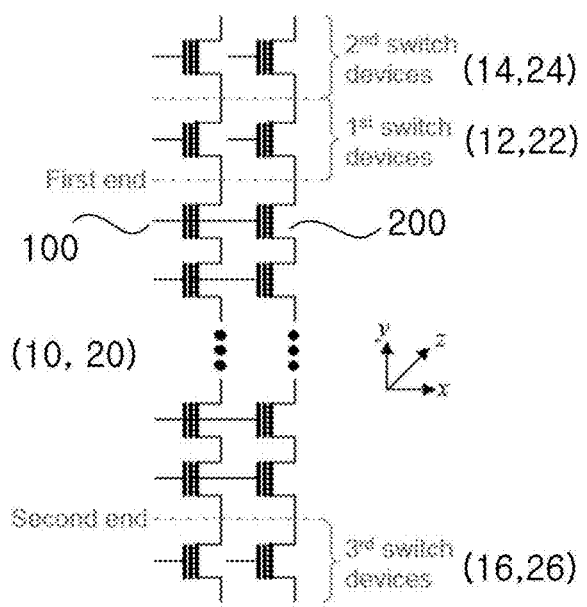

[Fig. 3]
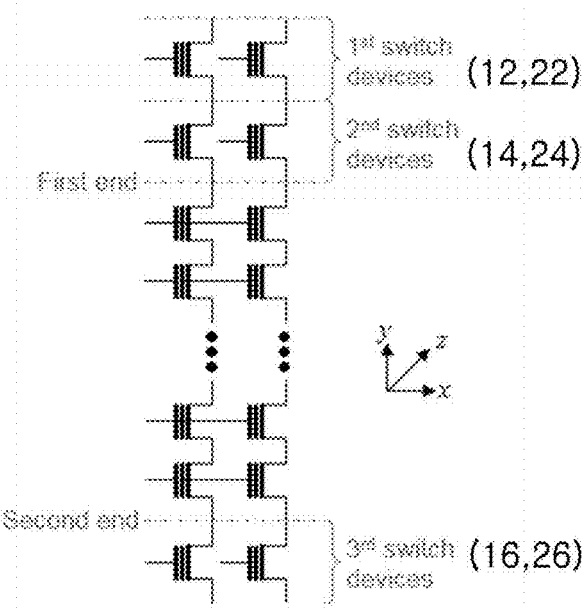
[Fig. 4A]   [Fig. 4B]   [Fig. 4C]
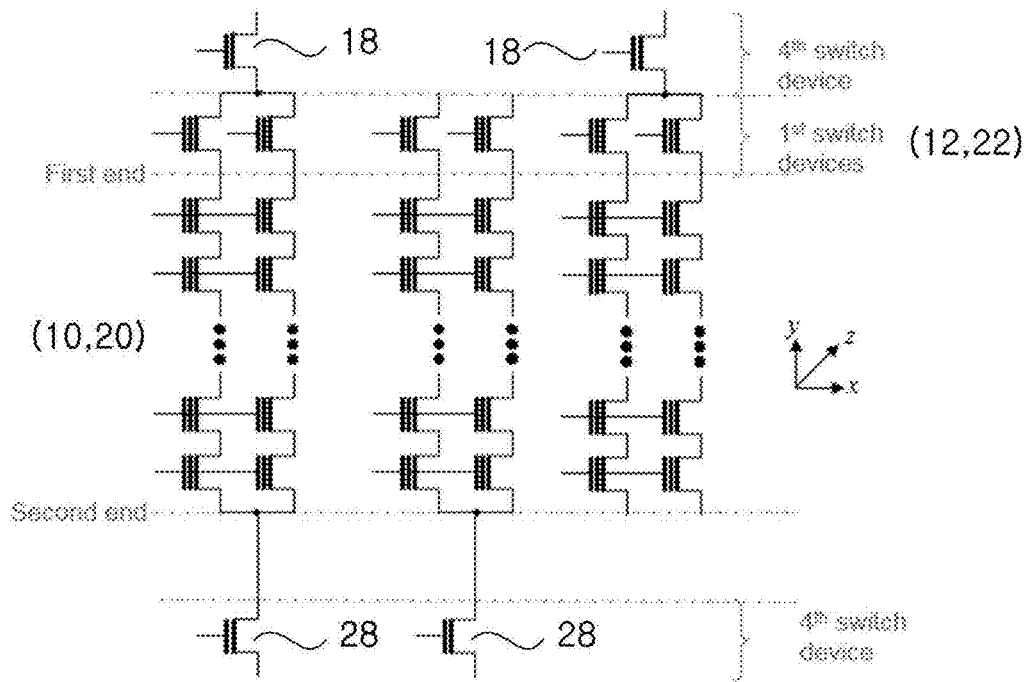

[Fig. 5]
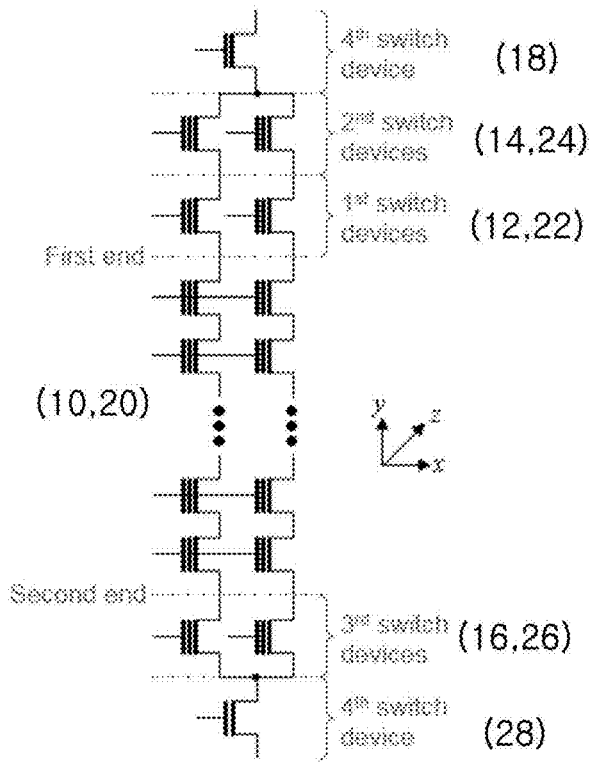
[Fig. 6]
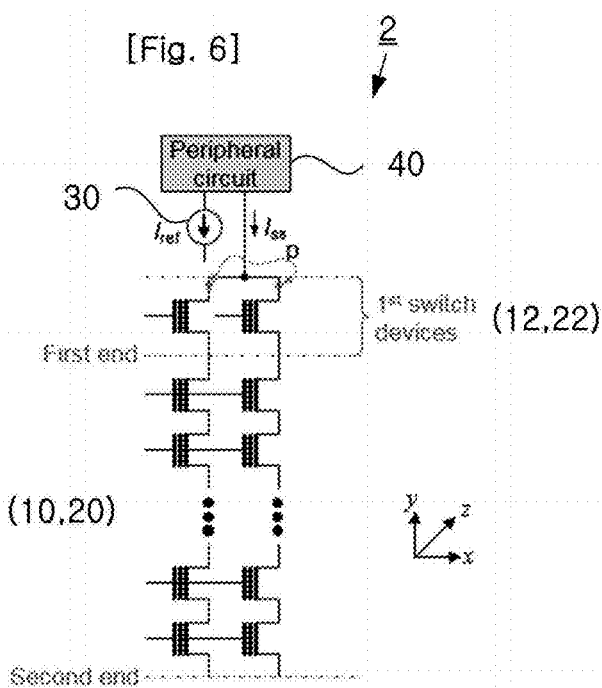

[Fig. 7C]
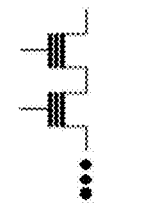
[Fig. 7A]
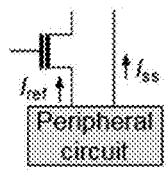
[Fig. 7B]
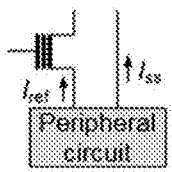
[Fig. 7D]
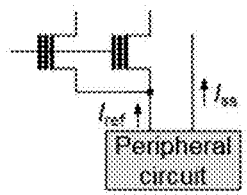
[Fig. 8A]
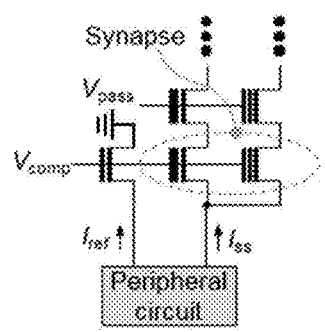
[Fig. 8B]
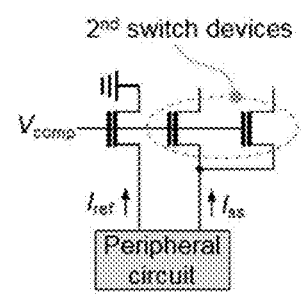
[Fig. 8C]
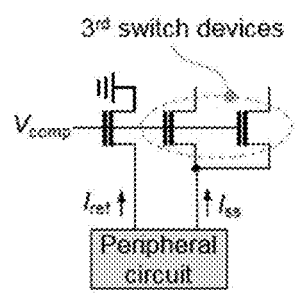
[Fig. 8D]
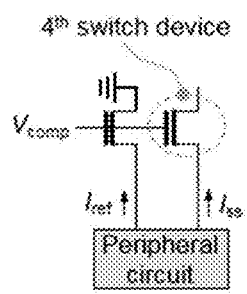

[Fig. 9A]
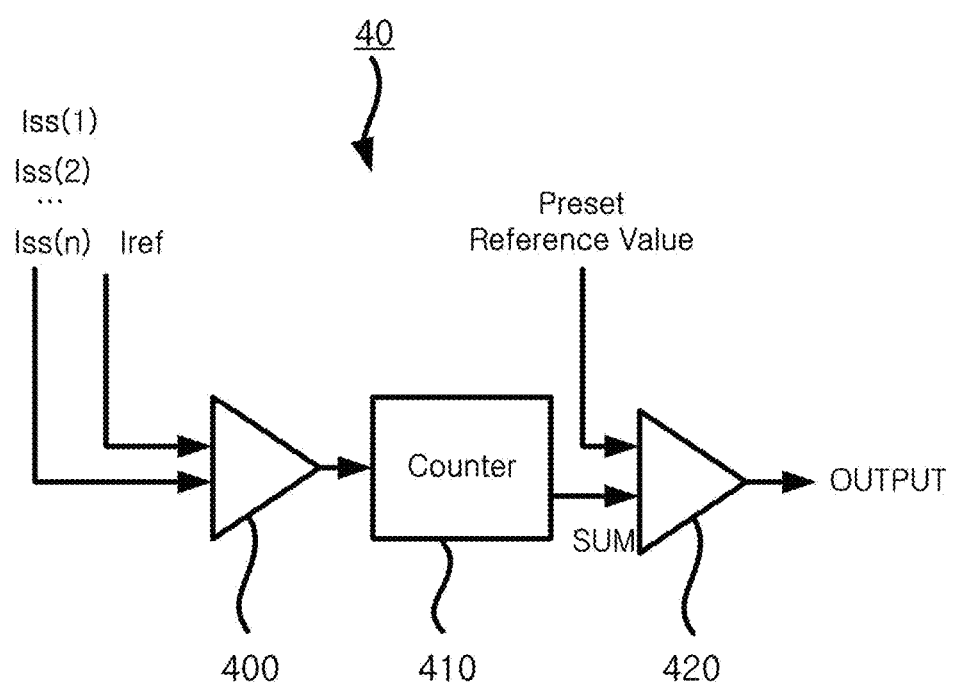

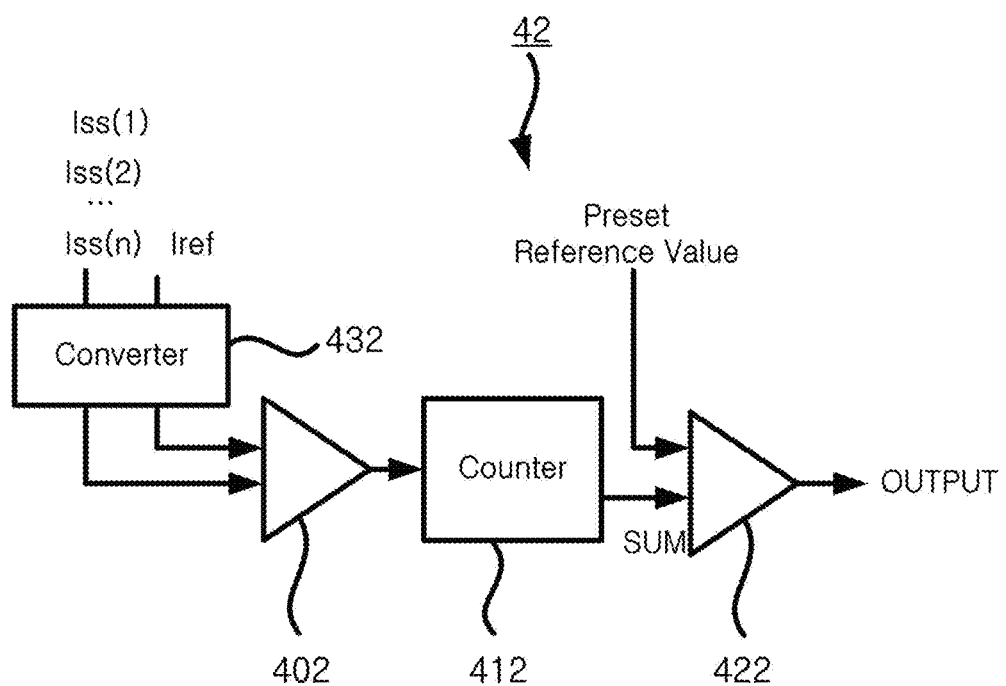
[Fig. 9B]

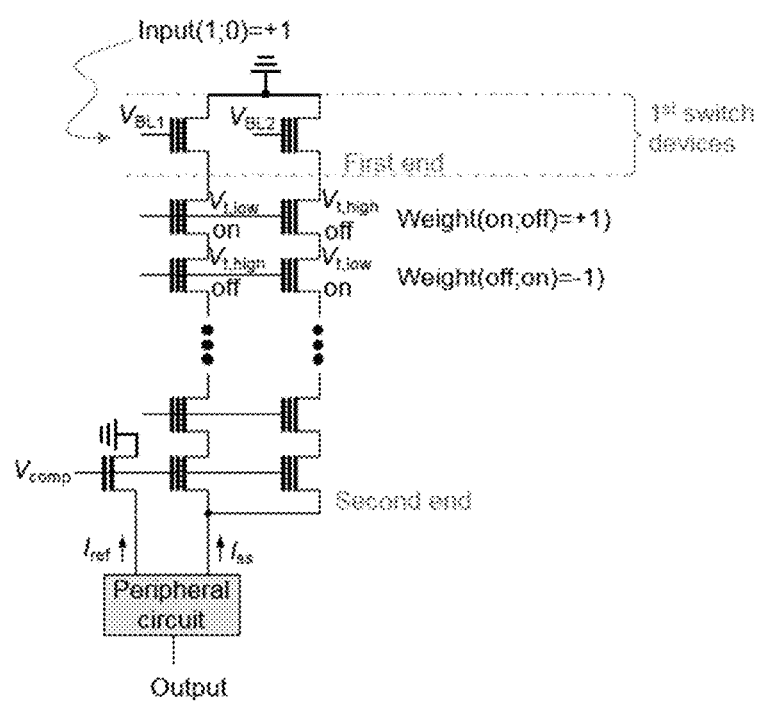
[Fig. 10]

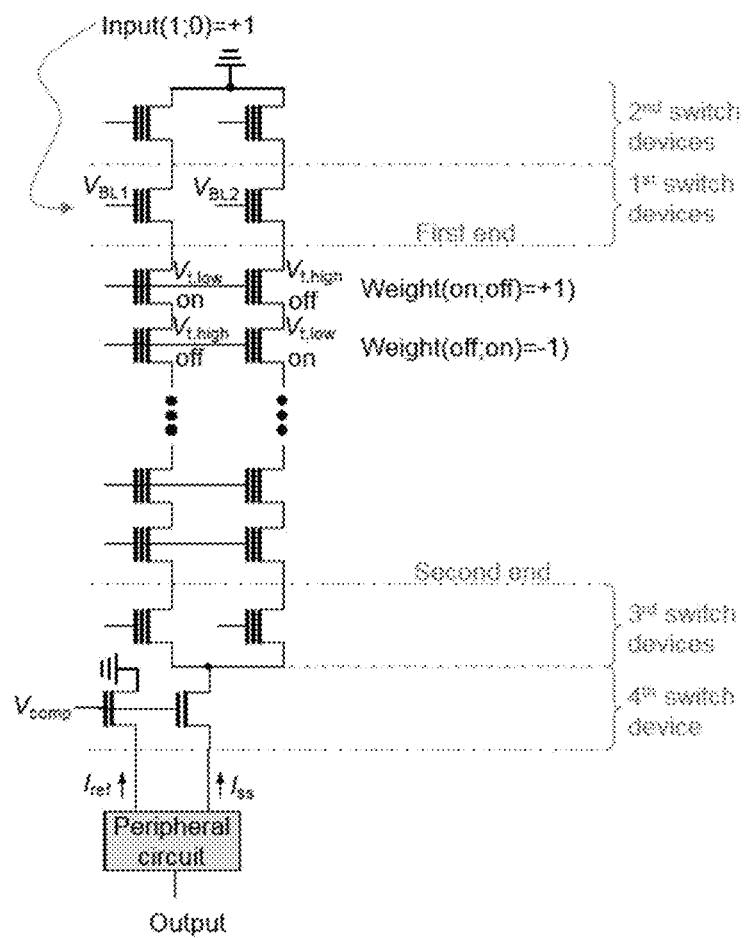
[Fig. 11]

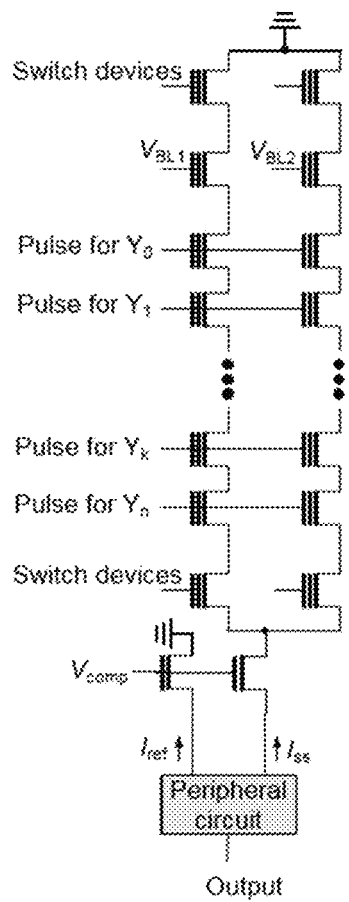
[Fig. 12A]

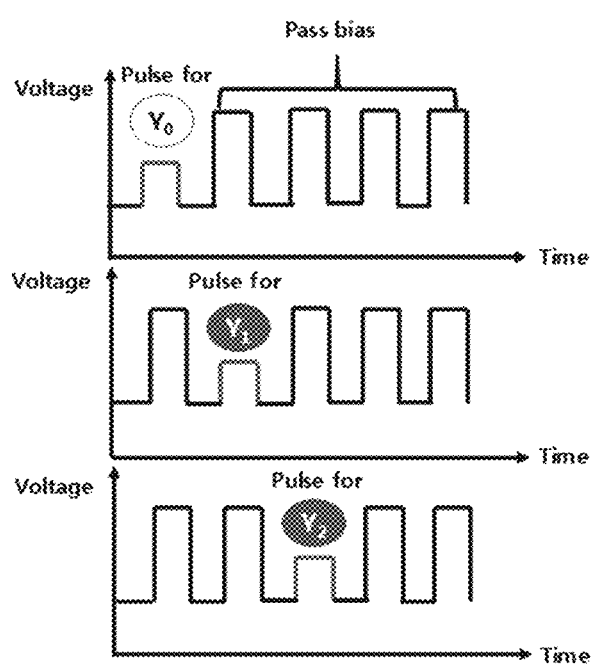
[Fig. 12B]

[Fig. 13]
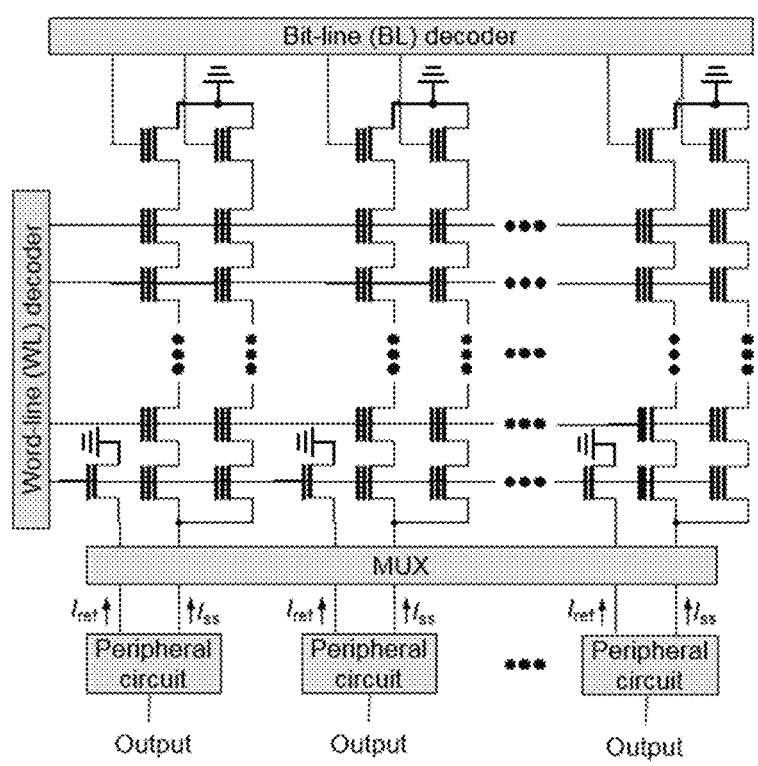

[Fig. 14]
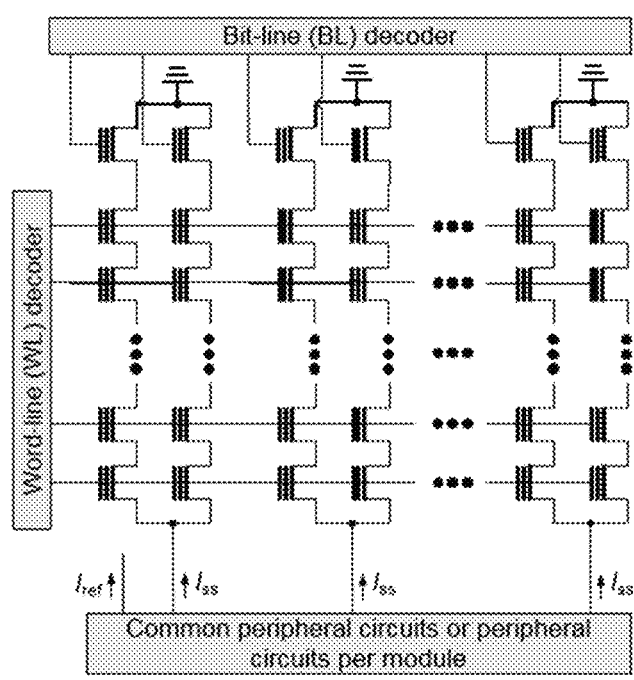

SYNAPSE STRING AND SYNAPSE STRING ARRAY FOR NEURAL NETWORKS

BACKGROUND OF THE INVENTION

1. Field of the Invention

The present invention relates to a neuromorphic technology that can be applied to various neural networks including binary neural networks, and more particularly, a neural network configured with a synapse string array using a synapse string including a plurality of synapse morphic devices having a high degree of integration, low power, and high durability by using two two-dimensional or three-dimensional memory cell strings and switch devices connected in series to the strings, synapse strings having a function of a neuron, and a synapse string array using the synapse strings.

2. Description of the Related Art

In recent years, many approaches have been made to imitate nervous systems of animals as power consumption has increased significantly and heat release problems have become more serious in integrated circuits based on the von Neumann architecture. Particularly, in the techniques imitating the nervous systems of animals, it is possible to improve the cognitive function and the determining function by enabling cognitive function and learning while greatly reducing power consumption.

As a result, there is an opportunity to replace or greatly improve the functionality of the existing von Neumann integrated circuits. Therefore, much attention has been increasingly paid to the technique, and the need for research has been greatly increased.

The basic function of neurons is to generate electrical spikes and transmit information to other cells in a case where a stimulus exceeds a threshold value. The resulting electrical signal is called an action potential. Neurons may be roughly divided into three portions. The neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging the stimulus occurs at the synapse. One nerve cell (neuron) receives stimuli through a number of synapses and integrates the excitations, and after that, the nerve cell transmits an electrical spike to an axon near to the nerve cell body, so that the electrical spike reaches the synapse.

In this manner, the transmission of the excitations from the neuron through the synapses to another nerve cell is referred to as excitation transmission. The excitation at the synapse is transmitted only from a nerve fiber toward a nerve cell body or a dendrite and is not transmitted in the reverse direction, so that the excitation is transmitted in only one direction as a whole.

In addition, the synapses are not only relay sites that transmit the excitations but the synapses also cause weighting or inhibition according to temporal or spatial change in excitations reaching the synapses to enable higher level integration of the nervous system.

On the other hand, besides the synapses having the action of transmitting the excitation, there are synapses having the action of inhibiting the transmission of the excitations from other nerve cells. These synapses are called inhibitory synapses. When the excitation transmitted along some nerve fibers reaches the inhibitory synapse, the inhibitory transmitting material is secreted from the synapse. This inhibitory transmitting material acts on a cell membrane of the nerve cell connected to the synapse to inhibit the excitations of the cell from occurring (occurrence of an action potential). As a result, while the inhibitory transmitting material acts, the excitation reaching other synapses is not transmitted to the synapse.

In this manner, the neuron performs an excitation transmitting function of transmitting the excitation from one or two or more neurons to the next neuron through the synapses. The neuron performs an excitation integrating/transmitting function of integrating the excitations transmitted from a plurality of neurons and transmitting the integrated excitation to the next neuron. The neuron performs an excitation inhibiting function of inhibiting inhibits the transmission of the excitation from other neurons.

Recently, binary neural networks have been actively studied, which limits the values of synapses and neurons to values of −1 and 1 and performs forward and reverse propagation. The binary neural networks are advantageous in terms of area and power due to elimination of multipliers. Recently, there have been attempts to implement binary neural networks by using RRAM devices (Xiaoyu Sun et al., "XNOR-RRAM: A Scalable and Parallel Resistive Synaptic Architecture for Binary Neural Networks", 2018 Design, Automation & Test in Europe Conference & Exhibition). Herein, a 2T2R structure was used as a synapse, and a structure of performing an XNOR operation by using the synapse was devised, and the structure was used for binary neural networks. However, in the case of a MEMRISTOR-based synapse of the related art, there are disadvantages in that the reliability of the device is not good and the dispersion between the devices is large.

In addition, recently, there have been attempts to implement binary neural networks by using logic gates (Daniel Bankman et al., "An always-on 3.8 uJ/86% CIFAR-10Mixed-signal binary CNN processor with all memory on chip in 28 nm CMOS", 2018ISSCC). However, implementing a binary neural network by using a logic gate according to the related art described above has a disadvantage in that reliability is good but a degree of integration is low due to using several devices.

Therefore, the present invention preferably proposes a method of implementing a binary neural network by using a NAND flash memory cell with high degree of integration and high reliability as a synapse morphic device and proposes a method being applicable to more complicated and diverse neural network by further changing the above method.

SUMMARY OF THE INVENTION

The present invention is to provide a synapse string including a plurality of synapse morphic devices and switch devices having high reliability, low power, and high degree of integration.

In addition, the present invention is to provide a synapse string including a peripheral circuit capable of implementing a function of a neuron in the synapse string and an array thereof.

In addition, the present invention is to provide a synapse string array including a plurality of synapse strings including a plurality of synapse morphic device and switch devices and peripheral circuits having high reliability, low power, and high degree of integration.

According to a first aspect of the present invention, there is provided a synapse string including: first and second cell strings, each having a plurality of memory cell devices connected in series; and first switch devices, each connected to one of two ends of each of the first and second cell strings, wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device, wherein the terminals electrically connected to each other of the memory cell devices being in one-to-one correspondence to each other are terminals to which a read or pass voltage is applied or a program or erase voltage is applied, and wherein the plurality of pairs of the memory cell devices included in the first and second cell strings constitute the plurality of synapse morphic devices.

In the synapse string according to the above-described aspect, it is preferable that the memory cell devices and the first switch devices constituting one synapse are configured so as to perform an XNOR operation.

In the synapse string according to the above-described aspect, it is preferable that each of the memory cell devices of the first and second cell strings is configured with a MOSFET having a non-volatile memory function, and gate terminals or control gate terminals of the memory cell devices constituting one pair are connected to each other.

In the synapse string according to the above-described aspect, it is preferable that each of the first switch devices is configured with one of a MOSFET, a MOSFET having a non-volatile memory function, and a device such as the memory cell device.

In the synapse string according to the above-described aspect, it is preferable that the synapse string is further comprising second and third switch devices, the second switch devices are provided connected in series to the respective first switch device or are provided in series between the first cell string and the respective first switch device and between the second cell string and the respective first switch device, the third switch devices are provided to be connected in series to the ends of the first and second cell strings to which the second switch devices are not connected, and each of the second and third switch devices is configured with one of a MOSFET, a MOSFET having a non-volatile memory function, and a device such as the memory cell device.

In the synapse string according to the above-described aspect, it is preferable that the synapse string is further comprising a fourth switch device, the fourth switch device is connected in series to one end or two ends of the two ends of the synapse string, and the fourth switch device is configured with one of a MOSFET, a MOSFET having a non-volatile memory function, and a device such as the memory cell device.

In the synapse string according to the above-described aspect, it is preferable that the pairs of the memory cell devices of the first cell string and the memory cell devices of the second cell string constituting one synapse are arranged at adjacent positions so that characteristics of the two devices are the same.

In the synapse string according to the above-described aspect, it is preferable that a read voltage is applied to a connected terminal of a pair of the memory cell devices constituting a specific synapse, a pass voltage is applied to connected terminals of the pairs of the memory cell devices constituting the remaining synapses except the specific synapse, and information stored in the memory cell devices constituting the specific synapse is read in a state where an input signal is applied to each of the input terminals of the first switch devices.

According to the second aspect of the invention, there is provided a synapse string comprising: first and second cell strings, each including a plurality of memory cell devices connected in series; first switch devices being connected to one of both ends of the first and second cell strings, respectively; a reference current source providing a reference current; and a peripheral circuit being sequentially input with synapse string currents for the respective synapses from the first and second cell strings, being input with the reference current $I_{ref}$ flowing from the reference current source, comparing the sequentially-input synapse string currents $I_{ss}$ for the respective synapses with the reference current, performing processing, and outputting the result, wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device, wherein the terminals electrically connected to each other of the memory cell devices being in one-to-one correspondence to each other are terminals applied with a read or pass voltage or applied with a program or erase voltage, and wherein a plurality of pairs of memory cell devices configured with the first and second cell strings constitute the plurality of synapse morphic devices.

In the synapse string according to the above-described aspect, it is preferable that the device constituting the reference current source is configured with a MOSFET or a device such as the memory cell devices of the first and second cell strings or is configured by connecting two or more devices such as the memory cell devices of the first and second cell strings in series or in parallel, and in a case where the device constituting the reference current source is a MOSFET, a length or width of a channel is adjusted.

In the synapse string according to the above-described aspect, it is preferable that the peripheral circuit includes: a first comparison circuit comparing sequentially-input synapse string currents for respective synapse morphic devices with the reference current and sequentially outputting comparison results; an integration circuit sequentially receiving and processing comparison result values for all the synapse morphic devices of the synapse string from the first comparison circuit; and a third comparison circuit comparing the final results of the integration circuit with a preset reference value, classifying the value into two values, and outputting the classified value.

In the synapse string according to the above-described aspect, it is preferable that the memory cell devices and the first switch devices constituting one synapse morphic device are configured so as to perform an XNOR operation.

In the synapse string according to the above-described aspect, it is preferable that the memory cell devices of the first and second cell strings are configured with MOSFETs having a non-volatile memory function, and gate terminals or control gate terminals the memory cell devices constituting a pair are connected to each other, and a read, pass, or program/erase voltage is applied.

In the synapse string according to the above-described aspect, it is preferable that each of the first switch devices is configured with one of a MOSFET, a MOSFET having a non-volatile memory function, and a device such as the memory cell device.

In the synapse string according to the above-described aspect, it is preferable that the synapse is further comprising second and third switch devices, the second switch devices are provided to be connected in series to the respective first switch devices or are provided to be connected in series between the first cell string and the respective first switch devices and between the second cell string and the respective first switch devices, the third switch devices are provided to be connected in series to the ends of the first and second cell strings to which the second switch devices are not connected, and each of the second and third switch devices is configured with one of a MOSFET, a MOSFET having a non-volatile memory function, and a device such as the memory cell device.

In the synapse string according to the above-described aspect, it is preferable that the synapse string is further comprising a fourth switch device, the fourth switch device is connected in series to the second and third switch devices or connected in series to any one of the second or third switch devices, and the fourth switch device is configured with one of a MOSFET, a MOSFET having a non-volatile memory function, and a device such as the memory cell device.

In the synapse string according to the above-described aspect, it is preferable that the pair of the memory cell device of the first cell string and the memory cell devices of the second cell string constituting one synapse morphic device are arranged in adjacent positions so that the characteristics of the two devices are configured to be the same.

According to the third aspect of the invention, there is provided a synapse string array comprising: first and second cell strings, each including a plurality of memory cell devices connected in series; switch devices being connected to one of both ends of the first and second cell strings, respectively; and a peripheral circuit being sequentially input with voltages sensed at any node p by the synapse string currents by the respective synapse morphic devices of the first and second cell strings, comparing a value obtained by integrating the sequentially-input voltages with preset reference values, performing processing, and outputting the result;

wherein the peripheral circuit includes: a reset switch being connected in series to the node (p), the node (p) being one node of one-side ends of the first and second cell strings and one-side ends of switch devices; a voltage sensing circuit reading the voltage of the node p; an integration circuit being sequentially input with voltages sensed at the node p by the synapse string currents of the first and second cell strings by the voltage sensing circuit and integrating the sequentially-input voltages; and a comparison circuit comparing the values obtained by integration of the integration circuit with a preset reference value and outputting compared values, wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device, wherein the terminals electrically connected to each other of the memory cell devices being in one-to-one correspondence to each other are terminals applied with a read or pass voltage or applied with a program or erase voltage, and wherein a plurality of pairs of memory cell devices configured with the first and second cell strings constitute the plurality of synapse morphic devices.

According to the fourth aspect of the invention, there is provided a synapse string array comprising: a plurality of the synapse strings according to the first aspect of the invention; and a peripheral circuit capable of processing the currents of the synapse strings in common or processing the currents of the synapse strings for each module, so that the plurality of synapse strings are arranged so as to be extended into an array.

According to the fifth aspect of the invention, there is provided a synapse string array comprising: a plurality of synapse strings according to the second and third inventions being arranged so as to be expanded into an array.

In the synapse string according to the first aspect described above, the memory cell devices and the first switch devices constituting one synapse morphic device are configured so as to perform an XNOR operation.

The synapse string array according to the second aspect of the present invention includes a peripheral circuit capable of processing the currents of the synapse strings in common or processing the currents of the synapse strings for each module, so that the plurality of synapse strings are arranged so as to be extended into an array.

The synapse strings according to the present invention includes the plurality of synapse morphic devices connected in series, and thus, it is possible to greatly improve the degree of integration.

In addition, the synapse morphic device of the synapse string according to the present invention is configured with two MOSFETs or flash memory cell devices including a charge storage layer, and thus, it is possible to obtain high durability and high reliability.

In addition, the synapse string according to the present invention is configured with a plurality of synapse morphic devices and the first switch devices connected in series, and thus, it is possible to perform a stable XNOR operation.

In addition, it is possible to manufacture the synapse string and synapse string array according to the present invention by using the existing two-dimensional or three-dimensional NAND flash technology. Therefore, in a case where the binary neural network is configured by using the synapse strings and the synapse string arrays according to the present invention, it is possible to greatly increase the degree of integration and the reliability of the binary neural networks and to reduce the power consumption.

In addition, by adding additional circuits and switches to the synapse string of the present invention, it is possible to implement ternary neural networks or more diverse neural networks, and it is possible to enable recognition of complicated and high-level data.

BRIEF DESCRIPTION OF THE DRAWINGS

FIGS. 1A and 1B are circuit diagrams illustrating a first example of a synapse string according to a first embodiment of the present invention;

FIG. 2 is a circuit diagram illustrating a second example of the synapse string according to the first embodiment of the present invention;

FIG. 3 is a circuit diagram illustrating a modified form of positions of the second switch devices in the second example of the synapse string according to the first embodiment of the present invention;

FIGS. 4A to 4C are circuit diagrams illustrating a fourth example of the synapse string according to the first embodiment of the present invention;

FIG. 5 is a circuit diagram illustrating a fifth example of the synapse string according to the first embodiment of the present invention;

FIG. 6 is a circuit diagram illustrating an example of a synapse string according to a second preferred embodiment of the present invention;

FIGS. 7A to 7D are circuit diagrams illustrating various examples of a reference current source 30 connected to a peripheral circuit 40 in the synapse string according to the second embodiment of the present invention;

FIGS. 8A to 8D are circuit diagrams illustrating various examples of a switch operation for comparing a current of a reference current source with a current of a basic synapse string in the synapse string according to the second embodiment of the present invention;

FIG. 9A is a block diagram schematically illustrating a first example of the peripheral circuit in the synapse string according to the second embodiment of the present invention;

FIG. 9B is a block diagram schematically illustrating a second example of the peripheral circuit in the synapse string according to the second embodiment of the present invention;

FIG. 10 is a circuit diagram illustrating an example of an XNOR operation using the first example of the basic synapse string, the peripheral circuit, and the current source in the synapse string according to the second embodiment of the present invention;

FIG. 11 is a circuit diagram illustrating an example of an XNOR operation using the fifth example of the basic synapse string, the peripheral circuit, and the current source in the synapse string according to the second embodiment of the present invention;

FIGS. 12A and 12B are circuit diagrams and graphs illustrated for explaining a pulse scheme applied to sequentially read currents of synapse morphic devices of the basic synapse string in the synapse string according to the second embodiment of the present invention;

FIG. 13 is a circuit diagram illustrating a first example of a synapse string array according to a third embodiment of the present invention; and FIG. 14 is a circuit diagram illustrating a second example of the synapse string array according to the third embodiment of the present invention.

DETAILED DESCRIPTION

In the present invention, preferably, provided is a synapse, in which a synapse morphic device is implemented with a pair of two cells of each string in two NAND flash memory cell strings and an XNOR operation can be performed by using the synapse morphic devices and switch devices provided in each cell string and which has string high reliability and high degree of integration preferably implement synapse morphic devices in pairs of two cells of each string.

In particular, the synapse morphic device according to the present invention can be allowed to store various amounts of negative (+) or positive (+) charges in the charge storage layer according to a program or erasure operation, and thus, a weight of a general synapse can be allowed to be changed. In addition, the synapse morphic device according to the present invention preferably uses a NAND flash memory cell, so that the synapse morphic device can be implemented with high reliability and small area.

In addition, the synapse string capable of XNOR operation according to the present invention includes a peripheral circuit reading the synapse morphic device, classifying the read values into two values, and outputting the two classified values in a manner similar to that of the operation of reading each cell in the cell string in an existing NAND flash memory for implementing a function of a neuron. To this end, a switch is connected to one end of the synapse string, and an end node of the switch is called P. The peripheral circuit further includes a voltage sensing circuit that is connected to a reset switch device for reset to the node P in series and reads the voltage of the node P.

In addition, the synapse string capable of XNOR operation according to the present invention includes a reference current source and a peripheral circuit for implementing a function of a neuron. The peripheral circuit has a function of comparing the value of current read from the synapses with the reference current values and classifying the compared values into two values.

In addition, the synapse string according to the present invention can be used for binary neural networks or various neural network systems.

Hereinafter, the synapse string and the synapse string array according to preferred embodiments of the present invention will be described in detail with reference to the accompanying drawings. The first embodiment of the present invention relates to various examples of the basic structures of the synapse string. The second embodiment of the present invention relates to various examples of the synapse string so as to be configured to be capable of performing a function of a neuron by including a peripheral circuit and a reference current source in the basic structure of the synapse string according to the first embodiment. The third embodiment of the present invention relates to various examples of the synapse string so as to be configured to be capable of performing a function of a neuron by including a switch for reset and a voltage sensing circuit in a basic structure of a synapse string according to a first embodiment. The fourth embodiment of the present invention relates to a synapse string array in which the plurality of synapse strings described above are connected to form an array.

First Embodiment

FIGS. 1A and 1B are circuit diagrams illustrating one example of a synapse string according to a first embodiment of the present invention.

Referring to FIGS. 1A and 1B, the synapse strings 1 according to the first embodiment of the present invention includes first and second cell strings 10 and 20 respectively having a plurality of memory cell devices 100 and 200 connected in series and first switch devices 12 and 22 respectively connected to one-side ends of both ends of the first and second cell strings. In the present specification, for convenience of description, the first switch devices are connected to one-side ends of both ends of the first and second cell strings, respectively, the ends of the first and second cell strings to which the first switch devices are connected are defined as first ends, and the remaining ends of the first and second cell strings are defined as second ends.

The memory cell devices 100 of the first cell string 10 and the memory cell devices 200 of the second cell string 20 are in one-to-one correspondence to each other, and a pair 300 of the memory cell devices being in one-to-one correspondence to one-to-one correspond constitutes one synapse morphic device. It is preferable that terminals electrically connected to each other of the memory cell devices constituting one synapse morphic device are terminals applied with a read or pass voltage or applied with a program or erase voltage, among the terminals of the memory cell devices. On the other hand, if necessary, a voltage for switching or a voltage for turning ON or OFF the reference current source may be applied to the terminals electrically connected to each other in the memory cell devices.

The plurality of pairs of memory cell devices included in the first and second cell strings constitute the plurality of synapse morphic devices, and as a result, the synapse strings including the first and second cell strings include a plurality of synapse morphic devices.

In the synapse string, the memory cell devices and the first switch devices constituting one synapse are preferably configured so as to perform an XNOR operation.

Each of the memory cell devices of the first and second cell strings is configured with a MOSFET having a non-volatile memory function, and in this case, gate terminals or control gate terminals of the memory cell devices constituting one pair are preferably connected to each other.

The first switch devices 12 and 22 are connected to only one-side ends of both ends of the first and second cell strings 10 and 20, respectively. In the present specification, for the convenience of description, the ends of the first and second cell strings to which the first switch devices 12 and 22 are connected respectively are defined as the first ends of the first and second cell strings, and the remaining ends of the first and second cell strings are defined as the second ends. Input signals respectively input to the input terminals of the first switch devices may be configured with signals from prior neurons.

The first switch devices may be configured with one among a MOSFET, a MOSFET having a non-volatile memory function, and a device such as the memory cell device. FIG. 1A illustrates the first switch devices configured as MOSFETs or flash memory cell devices having a non-volatile memory function, and FIG. 1B illustrates the first switch devices configured as MOSFETs. In this case, the input terminals of the first switch devices may be gate electrodes or control electrodes, and if the first switch device is a device having a non-volatile memory function, the threshold voltage can be changed by using the non-volatile memory function.

It is preferable that, in the synapse string, pairs of the memory cell devices of the first cell string and the memory cell devices of the second cell string constituting one synapse morphic device are arranged adjacent to each other so that the characteristics of the two devices are the same.

FIG. 2 is a circuit diagram illustrating a second example of the synapse string according to the first embodiment of the present invention. Referring to FIG. 2, the second example of the synapse string according to the first embodiment of the present invention is further characterized in that second and third switch devices are further included in the synapse string according to the first example described above. Therefore, the second example of the synapse string according to the first embodiment of the present invention includes first and second cell strings 10 and 20 each having a plurality of memory cell devices 100 and 200 connected in series, first switch devices 12 and 22 each connected to the first ends of the first and second cell strings, second switch devices 14 and 24 connected in series to the first switch devices, and third switch devices 16 and 26 each connected in series to the second ends of the first and second cell strings. Since the structures and operations of the first and second cell strings and the first switch devices are the same as those of the first example described above, redundant descriptions thereof will be omitted.

Each of the second switch devices 14 and 24 is preferably connected in series to the first switch devices as illustrated in FIG. 2.

FIG. 3 is a circuit diagram illustrating a modified form of the second switch devices in the second example of the synapse string according to the first embodiment of the present invention. The modified form of the second switch devices may be connected in series between the first switch devices and the first ends of the first and second cell strings, as illustrated in FIG. 3. The third switch devices 16 and 26 are preferably connected in series to the second ends of the first and second cell strings, respectively.

Similarly to the first switch devices, it is preferable that each of the second and third switch devices is configured with one of a MOSFET, a MOSFET having a non-volatile memory function, and a device such as the memory cell device.

In the second example of the synapse string according to the first embodiment of the present invention, the first switch is input with an input value INPUT, and the second and third switches are provided so that the memory cell devices in the first and second cell strings can be programmed or erased independently.

The first and second cell strings can be programmed or erased separately from each other by using the second and third switches, or the first and second cell strings can be programmed or erased together. On the other hand, in the case of configuring the synapse string array, by using the second switch and the third switch, a specific synapse string can be selected from the synapse string array to be operated.

A third example of the synapse string according to the first embodiment of the present invention is characterized in that a second switch device is further included in the synapse string according to the first example described above.

Therefore, the third example of the synapse string according to the first embodiment of the present invention include the first and second cell string each having a plurality of memory cell devices connected in series and the first switch devices and second switch devices, each connected to the first ends of the first and second cell strings. Since the structures and operations of the first and second cell strings and the first switch devices are the same as those of the first example described above, redundant descriptions thereof will be omitted.

The second switch devices are connected in series to the first switch devices. The second switch devices are connected in series between the first switch devices and the first ends of the first and second cell strings. The second switch devices are preferably connected in series to the second ends of the first and second cell strings. Or, the second switch devices are most preferably connected in series to the second ends of the second switch devices. In the most preferable case, when the cell device of each synapse morphic device is programmed/erased, the threshold voltage of the cell device can be controlled independently by using the first switch device and the second switch device. Similarly to the first switch devices, the second switch devices preferably includes one among a MOSFET, a MOSFET having a non-volatile memory function, and a device such as the memory cell device. The second switch device according to the third example is operated in the same manner as the second or third switch device according to the second example. The first switch device and the second switch device can be used at the time of changing the threshold voltage by independently programming or erasing the cell devices of the synapse morphic devices. In the XNOR operation, an input signal is provided to the input of the first switch device.

FIGS. 4A to 4C are circuit diagrams illustrating a fourth example of the synapse string according to the first embodiment of the present invention. Referring to FIGS. 4A to 4C, the fourth example of the synapse string according to the first embodiment of the present invention is characterized in that a fourth switch device is further included in the synapse string according to the first example described above. Therefore, the fourth example of the synapse string according to the first embodiment of the present invention includes the first and second cell strings 10 and 20 each having a plurality of memory cell devices 100 and 200 connected in series, first switch devices 12 and 22 each connected to the first ends of the first and second cell strings, and the fourth switch devices 18 and 28. Since the first and second cell strings and the first switch devices are the same as those of the first example described above, redundant descriptions thereof will be omitted.

The fourth switch devices 18 and 28 are connected in series to the first switch devices electrically connected to each other and are connected in series to the second ends of the first and second cell strings electrically connected to each other as illustrated in FIG. 4A. The fourth switch devices are connected in series to only the first switch devices electrically connected to each other as illustrated in FIG. 4B. Or, the fourth switch devices are preferably connected in series to the second ends of the first and second cell strings electrically connected to each other. Similarly to the first switch devices, the fourth switch devices preferably includes one among a MOSFET, a MOSFET having a non-volatile memory function, and a device such as the memory cell device.

In a case where a synapse string array including a plurality of synapse strings is implemented, the fourth switch can be used to select a specific synapse string among the plurality of synapse strings or to synchronize the reference current source and the corresponding synapse strings with each other to operate the synapse strings.

FIG. 5 is a circuit diagram illustrating a fifth example of the synapse string according to the first embodiment of the present invention. Referring to FIG. 5, the fifth example of the synapse string according to the first embodiment of the present invention is characterized in that a fourth switch device is further included in the synapse string according to the second example described above. Therefore, the fifth example of the synapse string according to the first embodiment of the present invention includes the first and second cell strings 10 and 20 each having a plurality of memory cell devices 100 and 200 connected in series, first switch devices 12 and 22 each connected to the first ends of the first and second cell strings, second switch devices 14 and 24 connected in series to the first switch devices, third switch devices 16 and 26 each connected in series to the second ends of the two cell strings, and fourth switch devices 18 and 28. Since the first and second cell strings and the first, second and third switch devices are the same as those of the second example described above, redundant descriptions thereof will be omitted.

The fourth switch devices 18 and 28 are connected in series to the second switch devices electrically connected to each other and are connected in series to the third switch devices electrically connected to each other as illustrated in FIG. 5. The fourth switch devices are connected in series to only the second switch devices electrically connected to each other. The fourth switch devices are connected in parallel to only the third switch devices electrically connected to each other. Similarly to the first switch devices, the fourth switch devices preferably includes one among a MOSFET, a MOSFET having a non-volatile memory function, and a device such as the memory cell device.

In a case where a synapse string array including a plurality of synapse strings is implemented, the fourth switch can be used to select a specific synapse string among the plurality of synapse strings or to synchronize the reference current source and the corresponding synapse strings with each other to operate the synapse strings.

Second Embodiment

Hereinafter, the synapse string according to the second embodiment of the present invention will be described in detail. The synapse string according to the second embodiment of the present invention is characterized in that a peripheral circuit and a reference current source are further included in the synapse string of the basic structure according to the first embodiment.

FIG. 6 is a circuit diagram illustrating an example of a synapse string according to a second preferred embodiment of the present invention. Referring to FIG. 6, the synapse string 2 according to the second embodiment of the present invention includes a synapse string 1 of a basic structure, a reference current source 30 for providing a reference current, and a peripheral circuit 40. The synapse string 1 of the basic structure may be configured with one of the first to fifth examples of the synapse string according to the first embodiment. The synapse string illustrated in FIG. 6 is characterized in that a reference current source and a peripheral circuit are further included in the synapse string of the basic structure according to the first example of the first embodiment. Therefore, referring to FIG. 6, the synapse string 2 according to the second embodiment of the present invention includes the first and second cell strings having the plurality of memory cell devices connected in series, first switch devices connected to one-side ends of both ends of the first and second cell strings, a reference current source, and a peripheral circuit, The peripheral circuit 40 includes at least first and second input terminals. In addition, the first input terminal is sequentially input with synapse string currents $I_{ss}$ for the respective synapse morphic devices from the basic synapse string, and the second input terminal is input with a reference current $I_{ref}$ flowing from the reference current source. The peripheral circuit sequentially compares the synapse string currents $I_{ss}$ for the respective synapse morphic devices input sequentially with the reference current and performs processing to output the result. The reference current source 30 provides a preset reference current $I_{ref}$ to the second input terminal of the peripheral circuit.

FIGS. 7A to 7D are circuit diagrams illustrating various examples of the reference current source 30 connected to the peripheral circuit 40 in the synapse string according to the second embodiment of the present invention. The devices constituting the reference current source may be configured with MOSFETs as illustrated in FIG. 7A, configured with MOSFETs or flash memory devices having a non-volatile function as illustrated in FIG. 7B, or configured with devices such as the memory cell devices of the first and second cell strings constituting the synapse string of the basic structure. As illustrated in FIGS. 7C and 7D, one or more devices such as the memory cell devices of the first and second cell strings may be connected in series or in parallel. In addition, in a case where the device constituting the reference current source is a MOSFET, it is preferable that the length or width of the channel is configured to be capable of being adjusted.

On the other hand, it is preferable that the device constituting the reference current source is electrically insulated from the synapse string of the basic structure and arranged as close as possible, so as to reduce the deviation between the synapse string current and the reference current, so that the comparison of the synapse string current and with the reference current can be performed accurately. In the synapse string of the basic structure, the memory cell devices and the first switch devices constituting one synapse morphic device are preferably configured to perform the XNOR operation.

FIGS. 8A to 8D are circuit diagrams illustrating various examples of a switch operation for comparing a current of the reference current source with a current of the basic synapse string in the synapse string according to the second embodiment of the present invention. Referring to FIGS. 8A to 8D, in a case where the reference current source is configured with a MOSFET, it is preferable that, by connecting the gate terminal of the reference current source and the gate terminal of the switch device of the synapse string of the basic structure together and applying the pulse voltage $V_{comp}$ at the same time, the currents are allowed to flow at the same time. FIG. 8A illustrates a case where the gate terminal of the reference current source and the gate terminals of the last synapse morphic device of the synapse string of the basic structure are connected. FIG. 8B illustrates a case where the gate terminal of the reference current source and the gate terminals of the second switch device of the synapse string of the basic structure are connected. FIG. 8C illustrates a case where the gate terminal of the reference current source and the gate terminals of the third switch device of the synapse string of the basic structure are connected. FIG. 8D illustrates a case where the gate terminal of the reference current source and the gate terminals of the fourth switch device of the synapse string of the basic structure are connected.

FIG. 9A is a block diagram schematically illustrating a first example of the peripheral circuit in the synapse string according to the second embodiment of the present invention. Referring to FIG. 9A, the first example of the peripheral circuit 40 includes a first comparison circuit 400, an integration circuit 410, and a second comparison circuit 420, and the first comparison circuit 400 compares the currents input from the reference current source and the cell string.

The first comparison circuit 400 includes at least first and second input terminals. The first input terminal is connected to one end of the basic synapse string to sequentially receive synapse string currents generated from the synapse morphic devices from the basic synapse string, and the second input terminal is connected to the output terminal of the reference current source to receive the reference current from the reference current source.

The first comparison circuit 400 is configured as a current comparator to compare the synapse string currents for each synapse sequentially input to the first input terminal with the reference current input to the second input terminal and to sequentially output the comparison results.

The integration circuit 410 may be configured as an analog circuit including digital counters, adders, or capacitors and may be sequentially input with the comparison result values for all the synapse morphic devices of the synapse strings from the first comparison circuit 400 to perform integration processing.

The second comparison circuit 420 is configured with a comparator to compare final result values of the integration circuit with a preset reference value, classify result values into two values and output two classified values.

On the other hand, the peripheral circuit is preferably configured to further include a current-voltage conversion circuits 430 at the first and second input terminals of the first comparison circuit 400 so as to convert the synapse string current provided from the basic synapse string and the reference current provided from the reference current source into respective voltages and to provide the voltages to the first comparison circuit.

FIG. 9B is a block diagram schematically illustrating a second example of the peripheral circuit in the synapse string according to the second embodiment of the present invention. Referring to FIG. 9B, the second example of the peripheral circuit 42 includes a first comparison circuit 402, an integration circuit 412, a second comparison circuit 422, and a current-voltage conversion circuit 432. The current-voltage conversion circuit 432 converts the currents input from the reference current source and the cell string into voltage and, after that, provides the voltages to the input terminals of the first comparison circuit 402. The first comparison circuit 402 compares the voltages input from the current-voltage conversion circuit and sequentially outputs comparison results. The integration circuit 412 and the second comparison circuit 422 may be configured in the same manner as the integration circuit 410 and the second comparison circuit 420 of the first example.

Third Embodiment

Hereinafter, a synapse string according to a third embodiment of the present invention will be described in detail. The synapse string according to the third embodiment of the present invention is characterized in that the synapse string of the basic structure according to the first embodiment further includes a peripheral circuit to implement a function of a neuron. Unlike the second embodiment, the third embodiment is characterized in that a reference current source is not included, and thus the peripheral circuit of the third embodiment is partially different from the peripheral circuit of the second embodiment. The synapse string according to the third embodiment may read specific synapse information of the synapse string in a manner similar to that of reading a specific cell in a cell string of an existing NAND flash memory.

The synapse string according to the third preferred embodiment of the present invention includes the synapse string of the basic structure and the peripheral circuit 40 connected to one end of the synapse string, and the synapse string of the basic structure may be configured with one of the first to fifth examples of the synapse string according to the first embodiment. The peripheral circuit includes a reset switch device, a voltage sensing circuit, an integration circuit, and a comparison circuit. The peripheral circuit is sequentially input with voltages obtained from the voltage sensing circuit in the read operation of the synapse morphic devices of the first and second cell strings, compares a result obtained by integrating the sequentially-input voltages with preset reference voltages, performs processing, and outputs the result.

The reset switch device may be configured with a transistor or the like, and the reset switch device is connected in series with one node (hereinafter referred to as a 'node P' for the convenience of description) among ends of the first and second cell strings and ends of the switch devices.

The voltage sensing circuit may be configured with, for example, an n-type MOSFET or a p-type MOSFET. In the read operation on the synapse morphic devices, the voltage of the node P is read and provided. It is possible to store a specific voltage by pre-charging charges by using the reset switch device in a capacitor or parasitic capacitor intentionally connected to the node P. The voltage can be changed little by little as charges escape with time elapsed, but the voltage may be changed significantly during read operations. If a current flows at the time of reading a specific synapse in the synapse string, the voltage of the precharged node will be decreased; and if no current flows, the voltage will remain at a high voltage. The voltage sensing circuit senses the voltage of the node P in this manner and provides the sensed voltage to the integration circuit.

The integration circuit is sequentially input with the voltages sensed at the node P by the cell string currents flowing by turn-ON of the respective synapse morphic devices of the first and second cell strings by the voltage sensing circuit, integrates the sequentially-input voltages, and provides the integrated result.

The comparison circuit compares a value provided by the integration circuit with a preset reference value to output a compared value. The integration circuit and the comparison circuit can be configured in the same manner as those of the second embodiment.

<Operations of Synapse String>

FIG. 10 is a circuit diagram illustrating an example of an XNOR operation using the first example of the basic synapse string, the peripheral circuit, and the current source in the synapse string according to the second embodiment of the present invention.

FIG. 11 is a circuit diagram illustrating an example of an XNOR operation using the fifth example of the basic synapse string, the peripheral circuit, and the current source in the synapse string according to the second embodiment of the present invention. In the synapse string illustrated in FIG. 11, the reference current source is configured with, for example, a MOSFET, the same pulse voltage $V_{comp}$ is applied to the gate of the fourth switch device at the end of the synapse string and the gate terminal of the reference current source, and the definitions and the operations are the same as those of the synapse string of FIG. 10. In the synapse string illustrated in FIG. 11, the device to which $V_{comp}$ is applied at the time of reading the current of the synapse string is turned ON, and both the second and third switch devices are turned ON.

In FIGS. 10 and 11, the memory cell device of the first cell string on the left is denoted by M1, the memory cell device of the second cell string on the right is denoted by M2, the value input to the first switch connected to the first cell string is denoted by $V_{BL1}$ and the value input to the first switch connected to the second cell string is denoted by $V_{BL2}$. Herein, M1 and M2 become one synapse morphic device. In FIGS. 10 and 11, it is assumed that the first switch device is the same as the memory cell device of the cell string.

For example, the definition of the input value INPUT and the weighting value (Synapse Weight) will be described with reference to Tables 1 and 2 below.

At this time, the input value and the weighting value may have two values of +1 or −1. That is, the input value of +1 denotes that the $V_{BL1}$ with a high voltage (1 state) is applied to the left switch device to be turned ON, and the $V_{BL2}$ with a low voltage (0 state) is applied to the right switch device to be turned OFF.

Tables 1 and 2 are tables illustrating example synapse weighting values according to threshold voltages of M1 and M2 and input values according to states of $V_{BL1}$ and $V_{BL2}$ in FIGS. 10 and 11, and Table 3 illustrates input values and output values according to the synapse weighting values.

First, as illustrated in Table 1, if a voltage corresponding to 1 state is input to $V_{BL1}$ and a voltage corresponding to 0 state is input to $V_{BL2}$ the input value is defined as +1; and the if a voltage corresponding to 0 state is input to $V_{BL1}$ and a voltage corresponding to 1 state is input to $V_{BL2}$ the input value is defined as −1.

TABLE 1

| $V_{BL1}$ | $V_{BL2}$ | INPUT |
|---|---|---|
| 1 | 0 | +1 |
| 0 | 1 | −1 |

In one synapse morphic device, as illustrated in Table 2, if the device of M1 is in the ON state with a low threshold voltage (low $V_{th}$), and the device of M2 is in the OFF state with a high threshold voltage (high $V_{th}$), the weighting value Synapse Weight is defined as +1. On the other hand, if the device of M1 is in the OFF state with a high threshold voltage (high $V_{th}$) and the device of M2 is in the ON state with a low threshold voltage (low $V_{th}$), the weighting value Synapse Weight is defined as −1. At this time, the input value and the weighting value may have two values of 1 or −1.

TABLE 2

| M1 Vth | M2 Vth | Synapse Weight |
|---|---|---|
| LOW (ON) | HIGH (OFF) | +1 |
| HIGH (OFF) | LOW (ON) | −1 |

Table 3 illustrates an example of the output values according to the input value and the synapse weighting value. As an example of operation, when a read voltage is applied to the input terminal of one synapse morphic device, a device having a low threshold voltage is turned ON, and a device having a high threshold voltage is turned OFF. In addition, if the input voltage $V_{BL1}$ of the first switch device is 1, the device is turned ON; and if the input voltage of the first switch device is 0, the device is turned OFF. It will only perform an XNOR operation with an output of 1 when the input value and weighting value are the same. As illustrated in Table 3, the synapse string according to the present invention is allowed to implement the XNOR operation.

TABLE 3

| INPUT | Synapse Weight | OUTPUT |
|---|---|---|
| +1 | +1 | 1 |
| −1 | +1 | −1 |
| +1 | −1 | −1 |
| −1 | −1 | 1 |

In the operation description of FIG. 10 or 11, the input value is allowed to have only +1 and −1 for the XNOR operation. This case is suitable for a binary neural network. If the input value is allowed to have 0 other than +1 and −1, a ternary neural network can be implemented. For example, $V_{BL1}$ and $V_{BL2}$ are in the 0 state or the 1 state at the same time as a state corresponding to the input value of 0. Of course, the weighting value, the reference current source, and the peripheral circuit of the synapse, can be changed so as to enable a ternary neural network. For example, if $V_{BL1}$ and $V_{BL2}$ are set to 1 state at the same time for the input value of 0, this information can be transmitted to peripheral circuits for processing so that this state can pass through an AND or NAND gate.

FIGS. 12A and 12B are circuit diagrams and graphs illustrated for explaining a pulse scheme applied to sequentially read currents of synapse morphic devices of a synapse string having a basic structure in the synapse string according to the second embodiment of the present invention.

Referring to FIGS. 12A and 12B, in an operation of reading the current of the synapse string, by applying a read voltage to a connected terminal of a pair of memory cell devices constituting a specific synapse morphic device, and by applying a pass voltage (Pass Bias) to the connected terminals of the pairs of memory cell devices constituting the remaining synapse morphic devices, the information stored in the memory cell devices constituting the specific synapse morphic device can be read in the state in which the respective input signals are applied to the input terminals of the first switch devices.

On the other hand, while reading the synapse string current for the specific synapse morphic device, a bias needs be applied to the second and third switches so as to be turned ON. In addition, the gate terminal of the reference current source and the gate terminal of the fourth switch device at the end of the synapse string of the basic structure are electrically connected to each other, and a voltage pulse $V_{comp}$ synchronized with the read voltage applied to the synapse morphic device is applied to the electrically-connected terminals, so that the synapse string current for the synapse morphic device can be read.

Fourth Embodiment

FIG. 13 is a circuit diagram illustrating a first example of a synapse string array according to a third embodiment of the present invention; and Referring to FIG. 13, the synapse string array according to the third embodiment of the present invention is characterized in that a plurality of synapse strings are arranged and expanded into an array, and the synapse string is one of the synapse strings according to the first and second embodiments. Herein, it is assumed that the reference current source is configured with a MOSFET.

In an example of the synapse string array according to the first example, in a case where the plurality of cell strings are used, a read voltage can be applied to the first switch device by using a bit-line (BL) decoder.

In addition, in one example of the synapse string array according to the first example, in a case where a plurality of cell strings or synapse strings are used, the read voltage and the pass voltage can be applied to the gate terminals of the memory cell devices constituting each synapse morphic device of the synapse strings by using a word-line (WL) decoder. In addition, if necessary, the WL decoder may control a voltage for turning ON the reference current source.

In the example of the synapse string array according to the first embodiment, in a case where the plurality of synapse strings are used, the current values of the synapse strings can be read simultaneously or sequentially and compared with the reference current of the reference current source. For example, as illustrated in FIG. 13, the synapse string array further includes a multiplexer (MUX) between the plurality of peripheral circuits and the plurality of synapse strings, so that the plurality of peripheral circuits can sequentially read the current values of the synapse strings. In a case where no MUX is used, the peripheral circuit needs be provided at least for each basic synapse string. In a case where the MUX is used, the peripheral circuits and the reference current sources of which numbers are smaller than the number of basic synapses may be provided and may sequentially read and output the currents.

FIG. 14 is a circuit diagram illustrating a second example of the synapse string array according to the third embodiment of the present invention. Referring to FIG. 14, the synapse string array according to the third embodiment of the present invention is characterized in that a plurality of basic synapse strings are arranged and expanded into an array, and a common peripheral circuit capable of processing the currents of the respective synapse strings in common or processing the currents for each module is provided. Herein, the device for the reference current source is not illustrated, but the description is made under the assumption that the device is configured with a MOSFET and included in the common peripheral circuit. In FIG. 14, only one reference current source is displayed under the assumption that the synapse strings are read sequentially one by one. However, in a case where the plurality of synapse strings are configured as one module, the plurality of reference current sources may be used.

In an example of the synapse string array according to the second example, in a case where the plurality of cell strings are used, a read voltage can be applied to the first switch device by using a bit-line (BL) decoder.

In addition, in one example of the synapse string array according to the first example, in a case where a plurality of cell strings or synapse strings are used, the read voltage and the pass voltage can be applied to the gate terminals of the memory cell devices constituting each synapse morphic device of the synapse strings by using a word-line (WL) decoder. Meanwhile, a voltage for turning ON the reference current source in the WL decoder can also be controlled.

In the example of the synapse string array according to the first example, in a case where the plurality of synapse strings are used, the current values of the synapse strings can be read sequentially and compared with the reference current of the reference current source. For example, the synapse string array further includes a multiplexer (MUX) between common peripheral circuits and the plurality of synapse strings, so that the plurality of peripheral circuits can sequentially read current values of the synapse strings.

In addition, one example of the synapse string array according to the first example is configured with the plurality of synapse strings as one module, and in an array configured with the plurality of modules, the synapse strings in the modules can be sequentially read and compared with the reference current source. In addition, in this case, the peripheral circuit may be configured for each module, and a multiplexer (MUX) can be used to sequentially read the synapse strings in the modules.

The synapse string including at least two cell strings and a switch device according to the present invention has high degree of integration due to a small occupied area and is reliable based on silicon technology. Since the synapse string can be used to implement various functions that need to be implemented in neuromorphic technology, the synapse string can be widely used in the field of neuromorphic technology.

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

What is claimed is:

1. A synapse string comprising:
   first and second cell strings, each having a plurality of memory cell devices connected in series; and
   first switch devices, each connected to one of two ends of each of the first and second cell strings,
   wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device,
   wherein the terminals electrically connected to each other of the memory cell devices being in one-to-one correspondence to each other are terminals to which a read or pass voltage is applied or a program or erase voltage is applied, and
   wherein the plurality of pairs of the memory cell devices included in the first and second cell strings constitute the plurality of synapse morphic devices.

2. The synapse string according to claim 1, wherein the memory cell devices and the first switch devices constituting one synapse are configured so as to perform an XNOR operation.

3. The synapse string according to claim 1,
   wherein each of the memory cell devices of the first and second cell strings is configured with a MOSFET having a non-volatile memory function, and
   wherein gate terminals or control gate terminals of the memory cell devices constituting one pair are connected to each other.

4. The synapse string according to claim 1, wherein each of the first switch devices is configured with one of a MOSFET, a MOSFET having a non-volatile memory function, and a device such as the memory cell device.

5. The synapse string according to claim 1, further comprising second and third switch devices,
   wherein the second switch devices are provided connected in series to the respective first switch device or are provided in series between the first cell string and the respective first switch device and between the second cell string and the respective first switch device,
   wherein the third switch devices are provided to be connected in series to the ends of the first and second cell strings to which the second switch devices are not connected, and
   wherein each of the second and third switch devices is configured with one of a MOSFET, a MOSFET having a non-volatile memory function, and a device such as the memory cell device.

6. The synapse string according to claim 1, further comprising a fourth switch device,
   wherein the fourth switch device is connected in series to one end or two ends of the synapse string, and
   wherein the fourth switch device is configured with one of a MOSFET, a MOSFET having a non-volatile memory function, and a device such as the memory cell device.

7. The synapse string according to claim 1, wherein the memory cell devices of the first cell string and the memory cell devices of the second cell string constituting one synapse are arranged at adjacent positions so that characteristics of the two memory cell devices constituting one synapse are the same.

8. The synapse string according to claim 1,
   wherein a read voltage is applied to a connected terminal of a pair of the memory cell devices constituting a specific synapse,
   wherein a pass voltage is applied to connected terminals of the pairs of the memory cell devices constituting the remaining synapses except the specific synapse, and
   wherein information stored in the memory cell devices constituting the specific synapse is read in a state where an input signal is applied to each of the input terminals of the first switch devices.

9. A synapse string comprising:
   first and second cell strings, each including a plurality of memory cell devices connected in series; and
   first switch devices being connected to one of both ends of the first and second cell strings, respectively;
   a reference current source providing a reference current; and
   a peripheral circuit being sequentially input with synapse string currents for the respective synapses from the first and second cell strings, being input with the reference current $I_{ref}$ flowing from the reference current source, comparing the sequentially-input synapse string currents $I_{ss}$ for the respective synapses with the reference current, and outputting the compared result,
   wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device,
   wherein the terminals electrically connected to each other of the memory cell devices being in one-to-one correspondence to each other are terminals applied with a read or pass voltage or applied with a program or erase voltage, and
   wherein a plurality of pairs of memory cell devices configured with the first and second cell strings constitute the plurality of synapse morphic devices.

10. The synapse string according to claim 9,
    wherein the device constituting the reference current source is configured with a MOSFET or a device such as the memory cell devices of the first and second cell strings or is configured by connecting two or more devices such as the memory cell devices of the first and second cell strings in series or in parallel, and
    wherein, in a case where the device constituting the reference current source is a MOSFET, a length or width of a channel is adjusted.

11. The synapse string according to claim 9, wherein the peripheral circuit includes:
    a first comparison circuit comparing sequentially-input synapse string currents for respective synapse morphic devices with the reference current and sequentially outputting comparison results;
    an integration circuit sequentially receiving and processing the comparison results for all the synapse morphic devices of the synapse string from the first comparison circuit; and
    a third comparison circuit comparing a final result of the integration circuit with a preset reference value, and outputting the compared result.

12. The synapse string according to claim 9, wherein the memory cell devices and the first switch devices constituting one synapse morphic device are configured so as to perform an XNOR operation.

13. The synapse string according to claim 9,
wherein the memory cell devices of the first and second cell strings are configured with MOSFETs having a non-volatile memory function, and
wherein gate terminals or control gate terminals the memory cell devices constituting a pair are connected to each other, and a read, pass, or program/erase voltage is applied.

14. The synapse string according to claim 9, wherein each of the first switch devices is configured with one of a MOSFET, a MOSFET having a non-volatile memory function, and a device such as the memory cell device.

15. The synapse string according to claim 9, further comprising second and third switch devices,
wherein the second switch devices are provided to be connected in series to the respective first switch devices or are provided to be connected in series between the first cell string and the first switch device and between the second cell string and the first switch device,
wherein the third switch devices are provided to be connected in series to the ends of the first and second cell strings to which the second switch devices are not connected, and
wherein each of the second and third switch devices is configured with one of a MOSFET, a MOSFET having a non-volatile memory function, and a device such as the memory cell device.

16. The synapse string according to claim 15, further comprising a fourth switch device,
wherein the fourth switch device is connected in series to the second and third switch devices or connected in series to any one of the second or third switch devices, and
wherein the fourth switch device is configured with one of a MOSFET, a MOSFET having a non-volatile memory function, and a device such as the memory cell device.

17. The synapse string according to claim 9, wherein the pair of the memory cell device of the first cell string and the memory cell devices of the second cell string constituting one synapse morphic device are arranged in adjacent positions so that the characteristics of the two devices are configured to be the same.

18. A synapse string comprising:
first and second cell strings, each including a plurality of memory cell devices connected in series;
switch devices being connected to one of both ends of the first and second cell strings, respectively; and
a peripheral circuit being sequentially input with voltages sensed at any node (p) by the synapse string currents by the respective synapse morphic devices of the first and second cell strings, comparing a value obtained by integrating the sequentially-input voltages with preset reference values, and outputting the compared result;
wherein the peripheral circuit includes:
a reset switch being connected in series to the node (p), the node (p) being one node of one-side ends of the first and second cell strings and one-side ends of switch devices;
a voltage sensing circuit reading a voltage of the node p;
an integration circuit being sequentially input with voltages sensed at the node p by the synapse string currents of the first and second cell strings by the voltage sensing circuit and integrating the sequentially-input voltages; and
a comparison circuit comparing the value obtained by integration of the integration circuit with a preset reference value and outputting compared result,
wherein the memory cell devices of the first cell string and the memory cell devices of the second cell string are in one-to-one correspondence to each other, and one-side terminals of pairs of the memory cell devices being in one-to-one correspondence to each other are electrically connected to each other to constitute one synapse morphic device,
wherein the terminals electrically connected to each other of the memory cell devices being in one-to-one correspondence to each other are terminals applied with a read or pass voltage or applied with a program or erase voltage, and
wherein a plurality of pairs of memory cell devices configured with the first and second cell strings constitute the plurality of synapse morphic devices.

19. The synapse string array comprising:
a plurality of the synapse strings according to claim 1; and
a peripheral circuit capable of processing the currents of the synapse strings in common or processing the currents of the synapse strings for each module, so that the plurality of synapse strings are arranged so as to be allowed to be extended into an array.

20. The synapse string array comprising:
a plurality of synapse strings according to claim 9 are arranged so as to be expanded into an array.

* * * * *